US007046976B2

(12) United States Patent
Le Naour et al.

(10) Patent No.: US 7,046,976 B2
(45) Date of Patent: May 16, 2006

(54) RECEIVING DEVICE WITH AUTOMATIC GAIN CONTROL

(75) Inventors: Jean-Yves Le Naour, Pace (FR); Patrice Hirtzlin, Betton (FR); Olivier Mocquart, Rennes (FR)

(73) Assignee: Thomson Licensing, Boulogne-Billancourt (FR)

( * ) Notice: Subject to any disclaimer, the term of this patent is extended or adjusted under 35 U.S.C. 154(b) by 413 days.

(21) Appl. No.: 10/075,833

(22) Filed: Feb. 13, 2002

(65) Prior Publication Data

US 2002/0115419 A1    Aug. 22, 2002

(30) Foreign Application Priority Data

Feb. 16, 2001  (FR) .................................. 01 02202

(51) Int. Cl.
*H04B 7/00* (2006.01)
(52) U.S. Cl. ............................. 455/240.1; 455/245.1; 455/250.1; 375/345
(58) Field of Classification Search ............. 455/232.1, 455/234.1, 240.1, 239.1, 241.1, 245.1, 250.1; 375/345
See application file for complete search history.

(56) References Cited

U.S. PATENT DOCUMENTS

| | | | | |
|---|---|---|---|---|
| 4,742,565 A | * | 5/1988 | Iwahashi | 455/234.2 |
| 5,199,045 A | * | 3/1993 | Kato | 375/141 |
| 5,483,691 A | * | 1/1996 | Heck et al. | 455/234.2 |
| 6,011,980 A | * | 1/2000 | Nagano et al. | 455/572 |
| 6,134,430 A | * | 10/2000 | Younis et al. | 455/340 |
| 6,226,504 B1 | * | 5/2001 | Takagi | 455/234.1 |
| 6,236,848 B1 | * | 5/2001 | Igarashi et al. | 455/341 |
| 6,285,863 B1 | * | 9/2001 | Zhang | 455/234.1 |
| 6,288,609 B1 | * | 9/2001 | Brueske et al. | 330/129 |
| 6,324,387 B1 | * | 11/2001 | Kamgar et al. | 455/234.1 |
| 6,373,907 B1 | * | 4/2002 | Katsura et al. | 375/345 |
| 6,690,944 B1 | * | 2/2004 | Lee et al. | 455/522 |
| 6,804,501 B1 | * | 10/2004 | Bradley et al. | 455/138 |

FOREIGN PATENT DOCUMENTS

EP   0777335   6/1997

OTHER PUBLICATIONS

Patent Abstracts of Japan, vol. 005, No. 113, Nov. 13, 1981 & JP 56108947 of Aug. 28, 1981.
French Search Report of Oct. 4, 2001.

* cited by examiner

*Primary Examiner*—Nguyen T. Vo
*Assistant Examiner*—Nhan T. Le
(74) *Attorney, Agent, or Firm*—Joseph J. Laks; Robert D. Shedd; Brian J. Cromarty

(57) ABSTRACT

The invention aims to minimize the analogue/digital converter over-dimensioning within the framework of reception of signals originating from a satellite and exhibiting power levels which can vary over time. The invention proposes a technique of automatic gain control which handles the setting of the noise level associated with the amplified signal. The automatic gain control is achieved by neutralizing the signal received by the antenna, and by adjusting the gain during the neutralization of the signal received until a predetermined noise level is obtained at the end of the reception facility. The invention also pertains to a device comprising the means for implementing the method.

6 Claims, 2 Drawing Sheets

RECEIVING DEVICE WITH AUTOMATIC GAIN CONTROL

The invention relates to a device with automatic gain control. Such a device is used in the facility for receiving radiofrequency communications, in particular of satellite type.

In a conventional satellite-based communication system, the reception input stage is built around a low-noise amplifier, for example of VLNA type (standing for Very Low Noise Amplifier). A conventional receiver structure associating an antenna with a transmission/reception device is given hereinbelow. In the reception path, the first stage, the so-called VLNA stage, amplifies the useful signal output by the antenna while minimizing its contribution in terms of noise. On reception, one of the major problems to be solved is the automatic gain control (hereinafter AGC) which makes it possible to accurately adjust the gain of the reception facility, so that the amplitude of the input signal to an analog to digital converter (hereinbelow ADC) is optimal. The number of useful quantization bits is then minimized, thereby enabling or aiding construction. The critical manner of operation of such a gain control device is accentuated in the case where the signals received exhibit a wide dynamic swing of instantaneous power variation: such is the case for example for a CDMA signal (standing for Code Division Multiple Access) combining a high number of codes, for which the ratio of peak power to mean power may be high. Specifically, the minimum number of quantization bits required will then be higher than for signals exhibiting a lower ratio of peak power to mean power. The limit of operation of the device is also accentuated in the case where the power of the signal received at the level of the antenna is prone to very fast alterations over time within a wide dynamic range: such is the case for example for a CDMA signal transmitted in bursts, and for which the number of codes used and the power assigned to each of them are prone to alter from one burst to another in an unpredictable manner.

Figure 1:
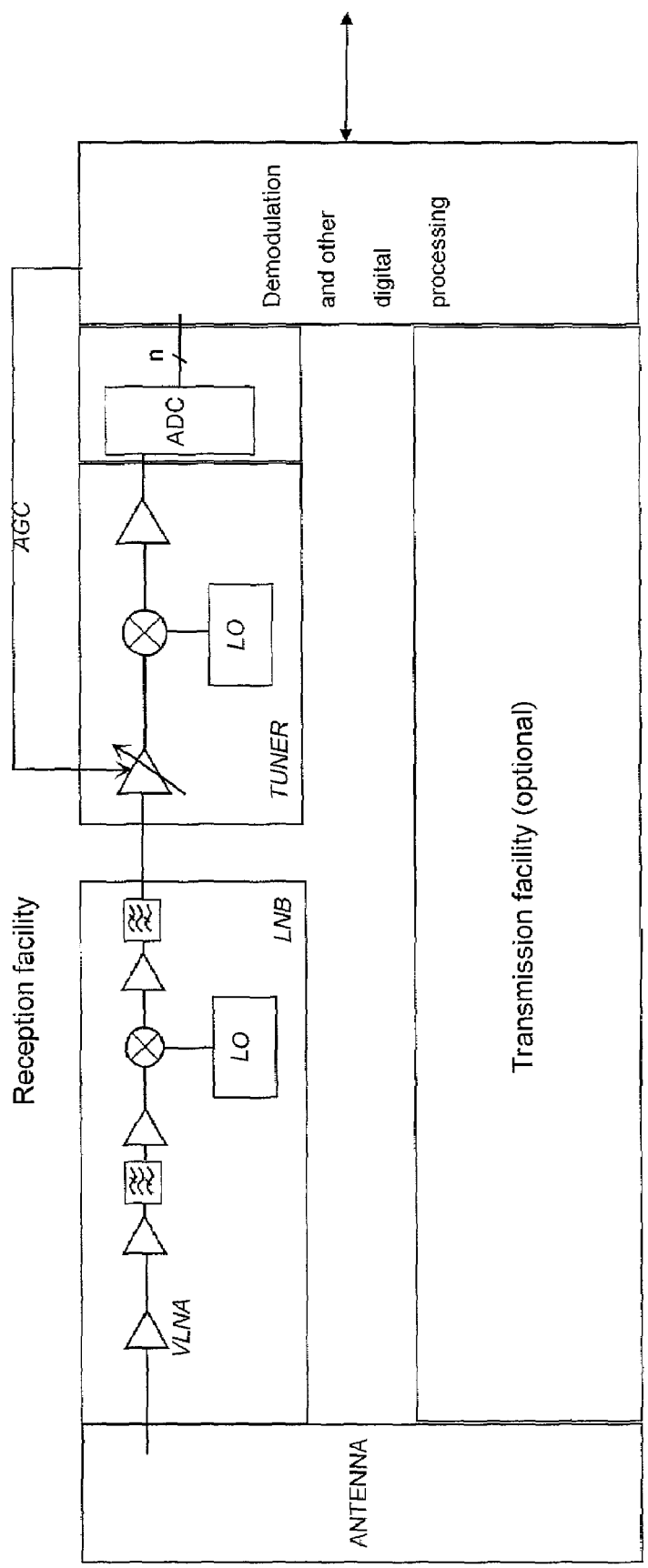

For conventional reception of continuous-train signals (typically digital TV reception via geostationary satellite), a technique commonly implemented for solving the problem posed consists in inserting a variable-gain amplifier into the reception facility. In this case, gain control can be implemented by slaving the signal power at the input of the ADC which alters very slowly over time. Automatic gain control is then undertaken after continuous evaluation of the power, of the amplitude distribution or of the probability of peak-clipping at the output of the ADC. A variable-gain element (attenuator or amplifier) set up in the reception facility is then acted on in such a way that the amplitude of the sampled signal is optimal. The device then compensates for the variations in stream received at the level of the antenna, as well as the scatter and fluctuations in gain in the reception facility. FIG. 1 describes in a simple manner the device then implemented in the reception facility.

In the case of the reception of signals whose power may alter very rapidly and unpredictably as a function of time, the technique described above cannot be implemented. One means of allowing the demodulation of the signal then consists in taking into account the total dynamic swing of possible power variation—without any automatic control—when dimensioning the ADC. However this approach leads to a considerable oversizing of the number of quantization bits required. Specifically, the scatter in gain in a reception facility with high gain operating within a wide temperature span is very considerable (typically greater than 30 dB for 90 dB of gain and 100° C. of temperature variation). This scatter can be reduced by calibrating the receiver in the factory at fixed frequency and at constant temperature but will nevertheless remain greater than 20 dB. This contribution requires the use of more than 3 extra quantization bits. These considerations may lead to a technological impossibility of construction in the case where the sampling frequency of the ADCs is high.

The invention aims to minimize the oversizing of the ADC within the framework of the reception of signals exhibiting power levels which vary over time. The invention proposes an automatic gain control technique which handles the setting of the noise level associated with the amplified signal.

The invention is a method of automatic gain control in a radiofrequency signal reception device, the said device comprising at least one first low-noise amplification stage placed following a reception antenna, and at least one variable-gain device placed in the reception facility. The method carries out steps of neutralization of the signal received by the antenna, and of adjustment of the gain during the neutralization of the signal received until a predetermined noise level is obtained at the end of the reception facility.

Such a method of gain control can be carried out upon switching on the device and also between the reception of bursts.

Preferably, one seeks to reduce the cost of construction. Accordingly, the neutralization of the signal received is carried out by cutting off the supply to the first low-noise amplification stage.

Under certain conditions of use, it is not possible to perform control of the gain between bursts. Accordingly, a second control can be performed during the reception of the signal by performing steps of extraction of the noise power at the end of the reception facility, and of adjustment of the gain until a predetermined noise level is obtained.

According to a second aspect, the invention is a radiofrequency signal reception device which comprises the means necessary for the implementation of the method.

According to a third aspect, the invention is a device for transmitting/receiving radiofrequency signals transmitted by satellite which comprises the above reception device.

Figure 2:
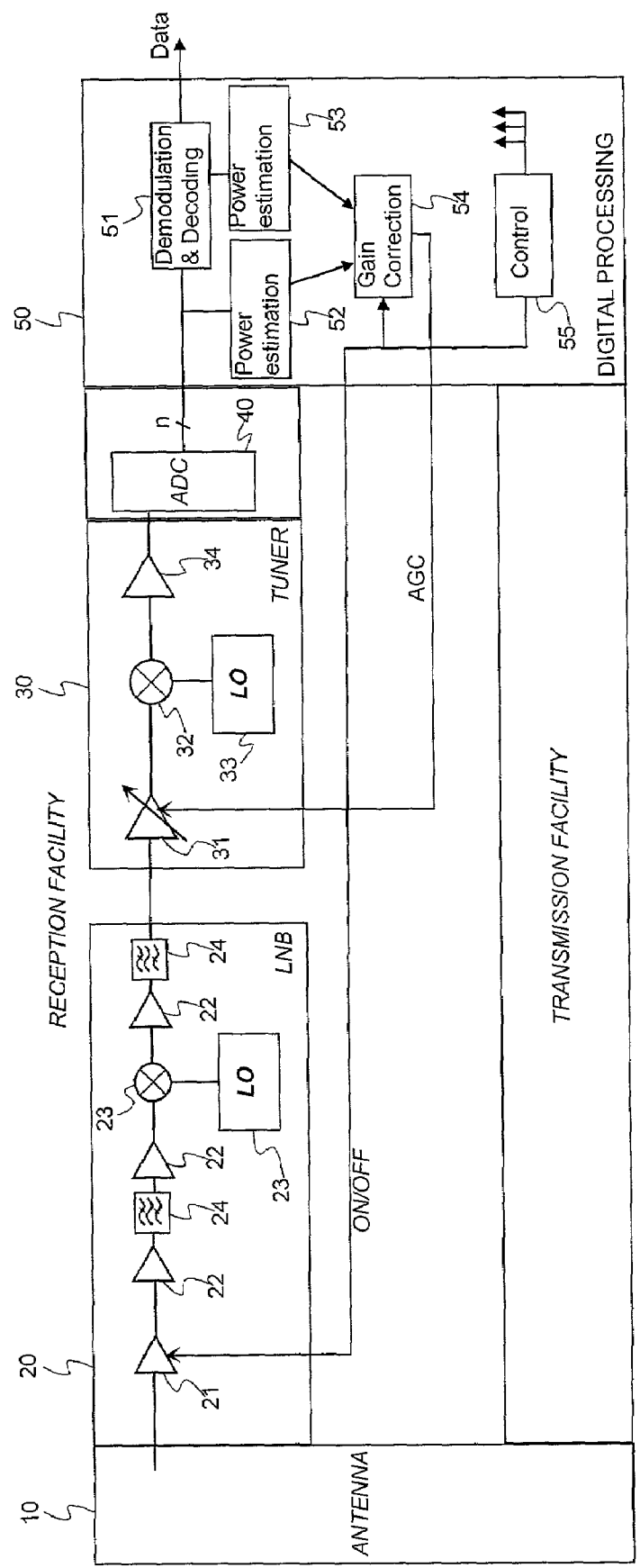

The invention will be better understood and other features and advantages will become apparent on reading the description which follows, the description making reference to the appended drawings among which:

FIG. 1 represents an exemplary satellite terminal reception facility for continuous-train signals, such as is known from the state of the art, FIG. 2 represents a satellite terminal reception facility according to the invention.

FIG. 2 represents a preferred embodiment of a satellite-based data transmission/reception device. FIG. 2 represents a functional diagram which more particularly details the reception facility. The transmission facility is not detailed since any type of transmission facility can be used.

An antenna 10 is connected to a low noise block 20, better known by the abbreviation LNB. The antenna 10 consists for example of a wave concentration device, such as a reflector or a lens, and of a wave to electrical signal conversion device. The waves received generally have frequencies for example greater than 10 GHz. A duplexer can be added between the antenna 10 and the LNB 20 if the transmission/reception device operates in full duplex mode.

The LNB 20 comprises at least one first stage of low-noise amplification 21, for example of VLNA type, of one or more other low-noise amplifiers 22, of means 23 for transposing the signal received into a band of intermediate frequencies, lying for example between 500 MHz and 2 GHz, and one or more filters 24. All these elements 21 to 24 are placed according to one of the techniques known to the person skilled in the art, for example as indicated in FIG. 2. However, the first amplification stage 21 is furnished with means which make it possible to neutralize the signal received. Preferably, the means of neutralization are relatively easily implemented supply switching means. When the first amplification stage 21 is not supplied, the remainder of the reception facility now transmits only the noise related to the various elements making up the said facility.

The output of the LNB 20 is linked to a tuner 30, for example by way of a coaxial cable if the tuner is situated in an internal unit. The tuner 30 comprises a variable-gain device 31, a mixer 32, a local oscillator 33, and possibly other means 34 of amplification and of filtering, these elements are for example connected as is indicated in FIG. 2. The variable-gain device 31 is preferably an amplifier but may also be an attenuator. The local oscillator 33 can be a controlled oscillator which makes it possible to select a channel in the intermediate frequency band. The transposition carried out by the mixer 32 and the oscillator 33 transposes for example a selected channel to baseband.

The output of the tuner 30 is connected to a device for digitizing the signal 40 which comprises sampling means and means of analogue/digital conversion which transforms the signal output by the tuner 30 into a digital signal coded on n bits. The digital signal is delivered to a digital processing device 50.

The digital processing device 50 comprises a demodulation and decoding circuit 51 which on a first output delivers a stream of demodulated and decoded data to a user device (not represented). The demodulation and decoding circuit furthermore comprises means for recoding and remodulating the data so as to deliver on a second output a modulated signal which corresponds to the signal received without noise.

A first power estimation circuit 52 measures the power of the digital signal.

A second power estimation circuit 53 measures the power of the modulated signal.

A supervisory circuit 55 delivers an on/off binary command which controls the supply to the first amplification stage 21. The on/off binary command can be transmitted for example with the aid of a carrier of a frequency distant from the intermediate band with the aid of the coaxial cable. The supervisory circuit 55 furthermore delivers commands (not represented) to the other elements of the circuit and caters for the sequencing of the digital processing device 50.

A gain correction circuit 54 receives the power measurements originating from the two power estimation circuits 52 and 53 as well as the on/off binary signal and delivers a gain set-point to the variable-gain device. The on/off binary signal indicates the conditions under which the gain set-point must be formulated.

A first automatic gain control is performed when the on/off binary signal neutralizes the first amplification stage 21. The neutralization can be carried out upon switching on the system and also between the reception of bursts. The first power estimation circuit 52 delivers the noise power of the complete transmission facility, apart from the first amplification stage 21. The gain correction circuit 54 will vary the gain of the variable-gain device 54 so that the power of the noise exiting the reception facility is restored to a first predetermined level. The predetermined level is chosen so that:

when the first amplification stage 21 is reactivated, the noise restored at the input of the analogue/digital conversion means must be weakly affected by the quantization noise, the peak-clipping of the useful signal combined with the noise restored by the analogue/digital conversion means must be minimized.

A second automatic gain control is performed dynamically during the reception of data. When the first amplification stage 21 is activated, the digital signal contains on the one hand the signal received and on the other hand noise. To get an estimate of the noise power, several techniques are possible. One technique consists in measuring on the one hand the power of the digital signal and on the other hand the power of the modulated signal which corresponds to the same signal minus noise. Then on the basis of these two powers, the gain control circuit 54 calculates the power of the noise. The gain correction circuit 54 supervises the variable-gain device 31 so that the noise power remains at a second predetermined level.

The second predetermined noise level is not the same as the first predetermined noise level since the latter takes into account the noise of the first amplification stage 21. A simple technique for obtaining the second predetermined level consists in performing the first automatic gain control then when the first stage 21 is reactivated and when a signal is locked on to (in general in a few milliseconds), the measured noise is stored as second predetermined level, thus taking account of the noise of the first stage 21 during switch-on.

The second automatic gain control makes it possible to generate a complementary command so as to compensate for the slow drifting of the gain which is due among other things to temperature variations.

By way of example regarding the performance of the invention, in the case of reception from a low-orbit satellite, the variation in the noise power at the input of the analogue/digital conversion means, once the first stage 21 has been reactivated may reach 7 dB (extreme cases of contributions from noise restored at the output of a VLNA). 5 dB are due to the variation in the noise contribution observed at the output of the antenna and 2 dB to the uncertainty in the gain of the VLNA (component scatter and temperature drift). This uncertainty range of 7 dB in the least favourable case constitutes a marked improvement as compared with the 20 dB previously considered for an entire reception facility constructed according to the state of the art. In this case, the impact on the dimensioning of an analogue/digital converter is substantially smaller (1 extra bit instead of 3 bits).

Numerous variants are possible. The preferred embodiment includes a first and a second gain control step, the first being "static" and the second being "dynamic". The combination of the two makes it possible to have continuous control of the gain of the reception facility. However, in certain cases of use, it is not necessary to have continuous control. By way of example, in a system for transmitting data dedicated to a receiver and in which the transmission is carried out with the aid of a succession of bursts destined for various receivers, it is then possible to perform the first gain control between two bursts destined for the relevant receiver, this first control possibly being performed for example every second. In this case, the second control is not necessary.

In the preferred embodiment, the neutralization of the first stage 21 is carried out by cutting off the supply. This simple and effective solution can be replaced by other neutralization devices. However, if the signal passing through the first stage 21 is regarded as being of very high frequency, the supply alone can be cut off with the aid of inexpensive means. It is also possible not to neutralize the first stage, the important thing being to neutralize the signal received from the antenna as far upstream as possible in the reception facility, so as to minimize the uncertainty regarding the amplified noise level after reactivation of the complete reception facility.

The reception facility can be modified to a large extent without departing from the scope of the invention. It is possible to use all types of reception facility. The LNB 20 can be replaced with a more or less complex external unit which can for example include a tuner. The variable-gain device 31 can be shifted over the entire length of the reception facility between the point of neutralization of the signal received and the end of the reception facility.

The invention claimed is:

1. A method for automatically controlling the gain in a radiofrequency signal reception device, said device comprising at least one first low-noise amplification stage placed following a reception antenna, and at least one variable-gain device placed in the reception facility, the method comprising the steps of:
   neutralization of the signal received by the antenna;
   a first adjustment of the gain during the neutralization of the signal received until a predetermined noise level is obtained at the end of the reception facility; and
   a second adjustment of the gain during signal reception until a predetermined noise power is obtained in which the extraction of the noise power is carried out by performing the following steps:
   sampling and digitization of the signal at the end of the reception facility,
   digital demodulation of the digitized signal,
   modulation of the demodulated signal,
   calculation of the noise power from the modulated signal and the digitized signal.

2. The method according to claim 1, wherein the neutralization of the signal received is carried out by cutting off the supply to the first low-noise amplification stage.

3. A radio frequency signal reception device, said device comprising:
   at least one first low-noise amplification stage placed following a reception antenna;
   at least one variable-gain device placed in the reception facility;
   means for neutralizing the signal received by the antenna; and
   means for adjusting the variable-gain device as a function of the noise level at the end of the reception facility;
   means of sampling and means of converting the signal at the end of the facility into a digitized signal,
   means for performing the digital demodulation of the signal and for obtaining a demodulated signal,
   means of digital modulation for modulating the demodulated signal and obtaining a modulated signal,
   means for calculating the noise power from the modulated signal and the digitized signal; and
   means for adjusting the variable gain device as a function of the noise level extracted.

4. The device according to claim 3, wherein the means for neutralizing the signal received are switching means which switch the supply of the first amplification stage.

5. A device for transmitting/receiving radiofrequency signals transmitted by a satellite comprising:
   at least one first low-noise amplification stage placed following a reception antenna; and
   at least one variable-gain device placed in the reception facility;
   means of sampling and means of converting the signal at the end of the facility into a digitized signal,
   means for performing the digital demodulation of the signal and for obtaining a demodulated signal,
   means of digital modulation for modulating the demodulated signal and obtaining a modulated signal,
   means for calculating the noise power from the modulated signal and the digitized signal; and
   means for adjusting the variable-gain device as a function of the noise level extracted.

6. The device according to claim 5, wherein the means for neutralizing the signal received are switching means which switch the supply of the first amplification stage.

* * * * *